United States Patent
Yamazoe et al.

(10) Patent No.: US 9,987,945 B2
(45) Date of Patent: Jun. 5, 2018

(54) RADIO BATTERY SYSTEM, AND CELL CONTROLLER AND BATTERY CONTROLLER THAT HAVE RADIO BATTERY SYSTEM

(71) Applicant: HITACHI, LTD., Tokyo (JP)

(72) Inventors: Takanori Yamazoe, Tokyo (JP); Kei Sakabe, Tokyo (JP)

(73) Assignee: Hitachi, Ltd., Tokyo (JP)

(*) Notice: Subject to any disclaimer, the term of this patent is extended or adjusted under 35 U.S.C. 154(b) by 362 days.

(21) Appl. No.: 14/938,442

(22) Filed: Nov. 11, 2015

(65) Prior Publication Data
US 2016/0137091 A1  May 19, 2016

(30) Foreign Application Priority Data
Nov. 13, 2014  (JP) ................................ 2014-230401

(51) Int. Cl.
  *H02J 7/00*  (2006.01)
  *B60L 11/18*  (2006.01)

(52) U.S. Cl.
  CPC ....... *B60L 11/1861* (2013.01); *B60L 11/1803* (2013.01); *Y02T 10/7005* (2013.01); *Y02T 10/92* (2013.01); *Y02T 90/16* (2013.01)

(58) Field of Classification Search
  CPC .................................................. H02J 7/0031
  USPC ........................................................ 320/136
  See application file for complete search history.

(56) References Cited

U.S. PATENT DOCUMENTS

| | | | | |
|---|---|---|---|---|
| 5,680,027 | A * | 10/1997 | Hiratsuka | G01R 31/3624 307/150 |
| 6,532,224 | B1 * | 3/2003 | Dailey | H04W 68/00 370/314 |
| 8,633,807 | B2 | 1/2014 | Sano | |
| 8,865,338 | B2 * | 10/2014 | Sugawara | H01M 2/1077 429/159 |
| 2010/0073003 | A1 | 3/2010 | Sakurai et al. | |
| 2013/0271146 | A1 * | 10/2013 | Sakabe | H02J 7/0016 324/415 |

(Continued)

FOREIGN PATENT DOCUMENTS

| | | |
|---|---|---|
| JP | 2005-135762 A | 5/2005 |
| JP | 2009-105667 A | 5/2009 |

(Continued)

OTHER PUBLICATIONS

Japanese Office Action dated Apr. 24, 2018 for the Japanese Patent Application No. 2014-230401.

*Primary Examiner* — Yalkew Fantu
(74) *Attorney, Agent, or Firm* — Volpe and Koenig, P.C.

(57) ABSTRACT

A radio battery system according to the present invention includes a battery controller and a plurality of cell controllers. The battery controller and the plurality of cell controllers communicate at a plurality of communication slots of a time division communication. The battery controller transmits data at a beginning of each of the plurality of communication slots. Each of the cell controllers measures a state of a cell at one or plurality of predetermined communication slots and transmits data at a predetermined communication slot. Each of the cell controllers is capable of switching between a normal transmission/reception mode and a sleep mode with a low power consumption.

10 Claims, 5 Drawing Sheets

(56) References Cited

U.S. PATENT DOCUMENTS

| | | | | |
|---|---|---|---|---|
| 2014/0152261 A1* | 6/2014 | Yamauchi | ........... | B60L 11/1866 320/118 |
| 2016/0006343 A1* | 1/2016 | Terada | .................... | H02J 17/00 307/104 |
| 2016/0056510 A1 | 2/2016 | Takeuchi et al. | | |
| 2016/0341797 A1* | 11/2016 | Sakabe | .................. | G01R 31/36 |

FOREIGN PATENT DOCUMENTS

| | | |
|---|---|---|
| JP | 2010-081716 A | 4/2010 |
| JP | 2011-166619 A | 8/2011 |
| WO | 2014/103008 A1 | 7/2014 |

* cited by examiner

RADIO BATTERY SYSTEM, AND CELL CONTROLLER AND BATTERY CONTROLLER THAT HAVE RADIO BATTERY SYSTEM

CLAIM OF PRIORITY

The present application claims priority from Japanese Patent application serial No. 2014-230401, filed on Nov. 13, 2014, the content of which is hereby incorporated by reference into this application.

BACKGROUND OF THE INVENTION

Field of the Invention

The present invention relates to a radio battery system, and a cell controller and a battery controller that have the radio battery system.

Description of Related Art

While global environmental issues have been largely highlighted, reduction of carbon dioxide gas emissions has been required in every scene to prevent global warming. Vehicles with a gasoline engine that are a major source of carbon dioxide gas emissions have begun to be replaced with hybrid electric vehicles and electric vehicles.

Since a large secondary battery that typifies power sources for hybrid electric vehicles and electric vehicles need to have a high power output and a large capacity. A battery module that composes the large secondary battery is formed of a plurality of cells connected in series.

A lithium ion battery that is a secondary battery needs to be appropriately handled to prevent it from being deteriorated due to charging at a high voltage and overdischarging. Thus, battery modules with which hybrid electric vehicles and electric vehicles are equipped have a function for measuring voltage, current, temperature, and the like to detect the states of their own cells.

FIG. 1 shows a structure of a battery module with which a hybrid electric vehicle or an electric vehicle is equipped.

As shown in the drawing, a battery module 500 is connected to a motor 570 through an inverter 560. Disposed between the battery module 500 and the inverter 560 is a relay box 550. The battery module 500 includes a plurality of cells 510, a cell controller 520 (hereinafter also referred to as "a CC"), and a battery controller 530 (hereinafter also referred to as "a BC"). Disposed between the battery controller 530 and the inverter 560 is a hybrid controller 540 that can communicate with both of the battery controller 530 and the inverter 560.

The plurality of cells 510 is connected to a CC. The CC measures states of the plurality of cells 510. A plurality of CCs is connected to a BC. The BC obtains states of the plurality of cells 510 from the plurality of CCs. The BC calculates State of Charge (SOC) and State of Health (SOH) from the obtained states of the plurality of cells 510 and notifies a host controller or the like of the calculation results.

The drawing shows that the BC and CCs communicate through wires. Japanese Patent Application Laid-Open Publication No. 2005-135762 (Patent Document 1) describes that CCs and a BC wirelessly communicate, not through wires to reduce a wiring cost, a high voltage insulation cost, and an assembling cost.

Japanese Patent Application Laid-Open Publication No. 2011-166619 (Patent Document 2) discloses an RF tag reader/writer that executes a communication process with RF tags based on a slotted ALOHA scheme that allows the device to communicate with RF tags as individual information acquisition targets at a plurality of time slots that compose a round. When the device receives a Query command, it generates a random number and decides one of the plurality of slots of one round at which it responds. The RF tag reader/writer described in Patent Document 2 is set to receive all Query-rep commands to recognize slot numbers.

SUMMARY OF THE INVENTION

When a conventional cell controller measures states of cells and transmits and receives a radio signal, the cell controller needs operating power. Patent Document 2 describes that operating power is supplied from a battery (cell). When the operating power of the cell controller is supplied from the battery, electric power stored in the battery and supplied to a load such as an inverter decreases. Thus, the cell controller needs to operate with a power consumption as low as possible.

An object of the present invention is to cause a cell controller to intermittently transmit and receive a radio signal and measure the states of cells to reduce its power consumption.

A radio battery system of an embodiment of the present invention includes: a battery controller; and a plurality of cell controllers. The battery controller and the plurality of cell controllers communicate at a plurality of time division communication slots. The battery controller transmits data at an initial communication slot of the plurality of communication slots. Each of the cell controllers measures a state of a cell at one or plurality of predetermined communication slots, and transmits data at a predetermined communication slot of each of the respective cell controllers. And each of the cell controllers is capable of switching between a normal transmission/reception mode and a sleep mode with a low power consumption.

According to the present invention, since the cell controller intermittently transmits and receives a radio signal and measures the states of cells, it can reduce its power consumption.

DETAILED DESCRIPTION OF THE PREFERRED EMBODIMENTS

Figure 1:
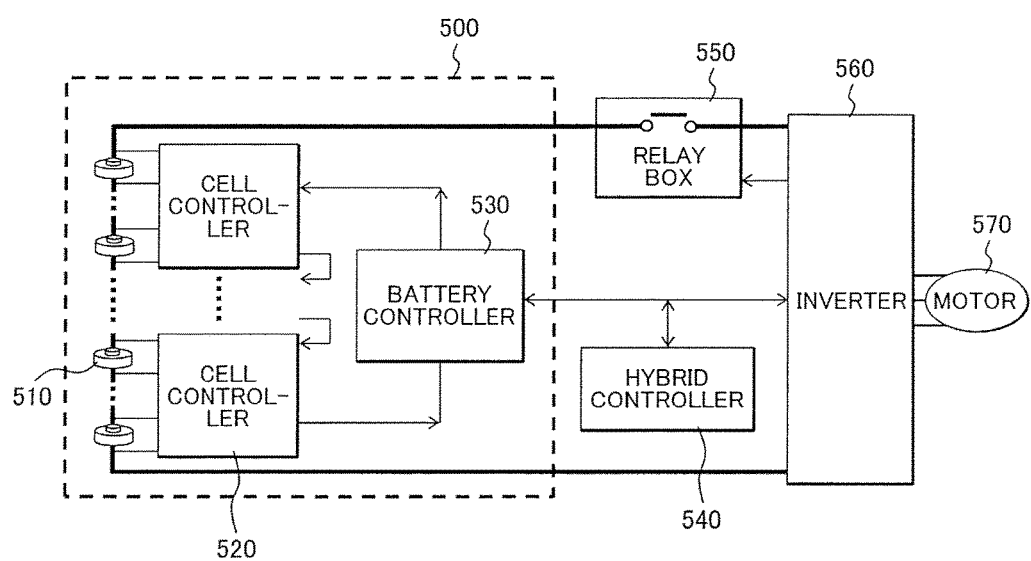
FIG. 1 is a schematic diagram showing a structure of a vehicle battery module.

Typical aspects disclosed in the present invention are outlined as follows.

In a radio battery system according to a radio protocol that allows a BC and a plurality of CCs to communicate based on a time division technique, the BC broadcasts data that represents a slot number and its own ID at the beginning of each communication slot. Each of the CCs measures states of cells at one or a plurality of predetermined communication slots and transmits data at a predetermined communication slot of each of the respective CCs. Unless each of the CCs transmits or receives data or measures the states of the cells at the predetermined communication slot, it enters a sleep mode with a low power consumption.

As a result, since each CC can intermittently transmit and receive a radio signal and measure the states of cells, it can operate with a low power consumption.

The present invention is also applicable to a module having a lead battery or the like along with a lithium ion secondary battery.

Preferred embodiments of the present invention will be described in detail below with reference to the accompanying drawings. The same reference numerals refer to the same parts in all figures for explaining embodiments and their duplicated description is omitted.

First Embodiment

Figure 2:
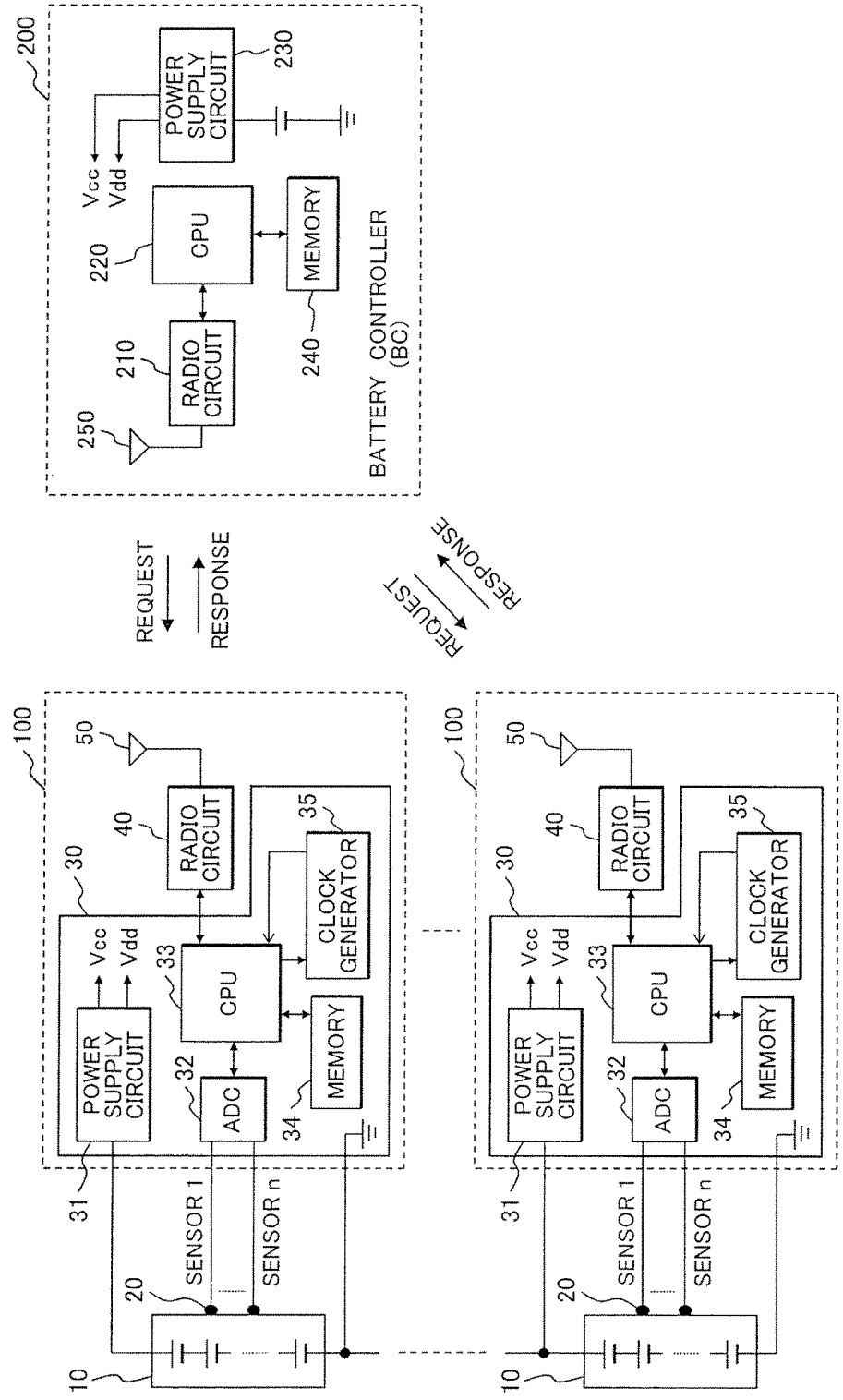
FIG. 2 is a schematic diagram showing a structure of a radio battery system according to the present invention.

FIG. 2 shows a basic structure of a radio battery system according to the present invention.

In this drawing, the radio battery system includes a cell group 10 that is formed of one or a plurality of cells, a cell controller 100 (CC) attached to the cell group 10, and a battery controller 200 (BC) that can communicate with the cell controller 100. The cell group 10 is provided with one or a plurality of sensors 20 (measurement instruments) that measure the states of the cells (voltage, current, temperature, and the like).

The cell controller 100 includes a processing unit 30 that obtains information representing the states of the cells and processes it, a radio circuit 40, and an antenna 50 that inputs and outputs a radio wave. The processing unit 30 includes a power supply circuit 31 that generates an operating voltage from the cell group 10 as a power source (a first power supply circuit that obtains an operating voltage from the cells to be measured), an A/D conversion circuit 32 (ADC) that converts analog values measured by the measurement instruments 20 into digital data, a processing circuit 33 (CPU) that outputs the data converted by the A/D conversion circuit 32 to a radio circuit, a memory 34 (storage unit) that stores an individual identification information (unique ID) and the like, and a clock generator 35.

The clock generator 35 can selectively generate high speed clocks as high as several MHz and low speed clocks as low as several tens kHz. The processing circuit 33 can turn ON/OFF part of the radio circuit 40 and the processing circuit 33, select the clock frequency of the clock generator 35, read/write data from/to the memory 34, and execute commands received from the battery controller 200 depending on data received from the radio circuit 40.

The battery controller 200 includes a radio circuit 210, a processing circuit 220, a power supply circuit 230 having a cell, a memory 240 (storage unit), and an antenna 250. Although the power supply circuit 230 shown in FIG. 2 is equipped with a cell, the power supply circuit 230 may be energized with an external power supply.

Normally, the battery controller 200 communicates with one or more cell controllers 100 and obtains the states of the cells (the state of the battery) measured by the cell controllers 100. At this point, the cell controllers 100 and the battery controller 200 communicate on time division basis (refer to FIG. 3). This radio communication scheme may be a slotted ALOHA scheme based on an RFID system. Herein, the RFID is abbreviation for Radio Frequency Identification.

Since the numbers of cells disposed in vehicle or industrial battery modules are predetermined, the battery controller 200 sets the number of communication slots of a time division communication corresponding to the number of cells and wirelessly communicates with the cell controllers 100 at the communication slots that have been set.

Before each cell controller 100 communicates with the battery controller 200, an ID of the battery controller 200, the unique ID or slot ID, and the number of the communication slots are written in the memory 34. The cell controller 100 selects a communication slot corresponding to the unique ID or slot ID and communicates with the battery controller 200. When the slot ID of the cell controller 100 is 10, it selects communication slot 10 (10-th communication slot). Likewise, when the slot ID of the cell controller 100 is 85, it selects communication slot 85 (85-th communication slot).

Figure 3:
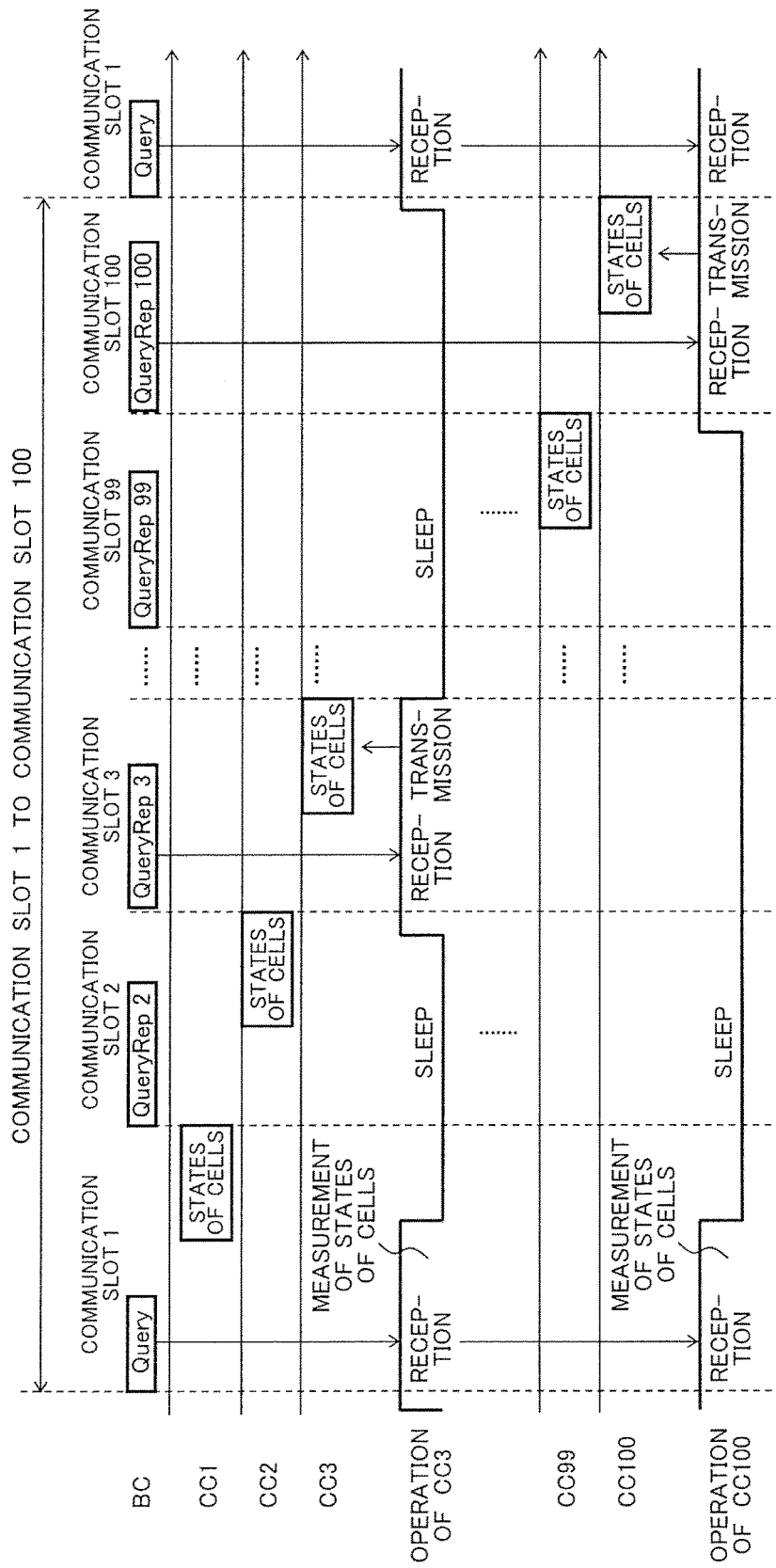
FIG. 3 is a timing chart showing a radio communication according to a first embodiment of the present invention.

FIG. 3 is a timing chart showing a communication between the battery controller 200 and the plurality of cell controller 100 shown in FIG. 2. In FIG. 3, the horizontal axis represents time, whereas the vertical axis represents each CC entering a normal transmission/reception mode or a sleep mode with a low power consumption.

This drawing shows that the battery controller 200 communicates with for example 100 cell controllers 100 (CC 1 to CC 100) at 100 communication slots. As the number of communication slots, 100 (100 communication slots) is written to the memory 34 of each cell controller 100. As the slot IDs, slot 1, slot 2, . . . , slot 100 are written to CC 1, CC 2, . . . , CC 100, respectively.

The battery controller 200 transmits a command that represents the beginning of slot 1 including its own ID (identification information) (for example, a Query command). The battery controller 200 preferably broadcast this command. The Query command may contain a command that represents the number of communication slots=100.

Before receiving the Query command, CC 1 to CC 100 enter the reception state (transmission/reception mode). When CC 1 to CC 100 receive the Query command, they measure the states of their own cells (for example, voltage, current, temperature) and maintain the states of the cells. Thereafter, CC 2 to CC 100 enter the sleep mode in which they operate with a low power consumption. In contrast, CC 1 transmits the states of the cells and then enters the sleep mode.

This drawing exemplifies states of CC 3 and CC 100.

On the other hand, the battery controller 200 receives the states of the cells from CC 1. Alternatively, the battery controller 200 transmits the Query command, waits for a predetermined period of time, and then transmits a command that represents the beginning of slot 2 including its own ID (for example, QueryRep2). Immediately before CC 2 receives the QueryRep2 command, it changes its mode from the sleep mode to the reception state. When CC 2 receives the QueryRep2 command, it transmits the stored states of the cells and then enters the sleep mode.

The battery controller 200 receives the states of the cells from CC 2. Alternatively, the battery controller 200 transmits the QueryRep2 command and then waits for a predetermined period of time. Thereafter, the battery controller 200 transmits a command that represents the beginning of slot 3 including its own ID (for example, QueryRep3). Immediately before CC 3 receives the QueryRep3 command, it changes its mode from the sleep mode to the reception state. When CC 3 receives the QueryRep3 command, it transmits the stored states of the cells and then enters the sleep mode. The battery controller 200 receives the states of the cells from CC 3. Alternatively, the battery controller 200 transmits the Query 3 command, waits for a predetermined period of time, and then transmits a command that represents the beginning of slot 4 including its own ID (for example, QueryRep4). Thereafter, CC 4 to CC 100 and the battery controller 200 repeat the foregoing operations.

This drawing shows only CC 3 of CC 1 to CC 100.

Immediately before CC 1 to CC 99 receive the Query command, they change their mode from the sleep mode to the reception state and receive the Query command. When CC 100 receives a QueryRep100 command, it transmits the stored states of the cells, enters the reception state, not the sleep mode, and receives the Query command.

The operations of CCs and BC are outlined as follows.

As exemplified by CC 3, each CC receives a Query command that represents slot 1. Thereafter, each CC measures the states of its cells (for example, voltage, current, and temperature), stores the states of the cells, sleeps until it receives an assigned communication slot, and transmits the states of the cells at the assigned communication slot. After each CC transmits the states of the cells, it sleeps until it receives a Query command that represents slot 1. Thus, since each CC enters the transmission/reception mode that intermittently consumes power, the power consumption can be reduced.

Second Embodiment

According to the first embodiment, before each communication slot occurs, a BC transmits data that represents each communication slot including its own ID to define each communication slot. In contrast, according to a second embodiment, a BC transmits data that represents the initial slot at the beginning of the communication slots and defines successive communication slots based on time.

Figure 4:
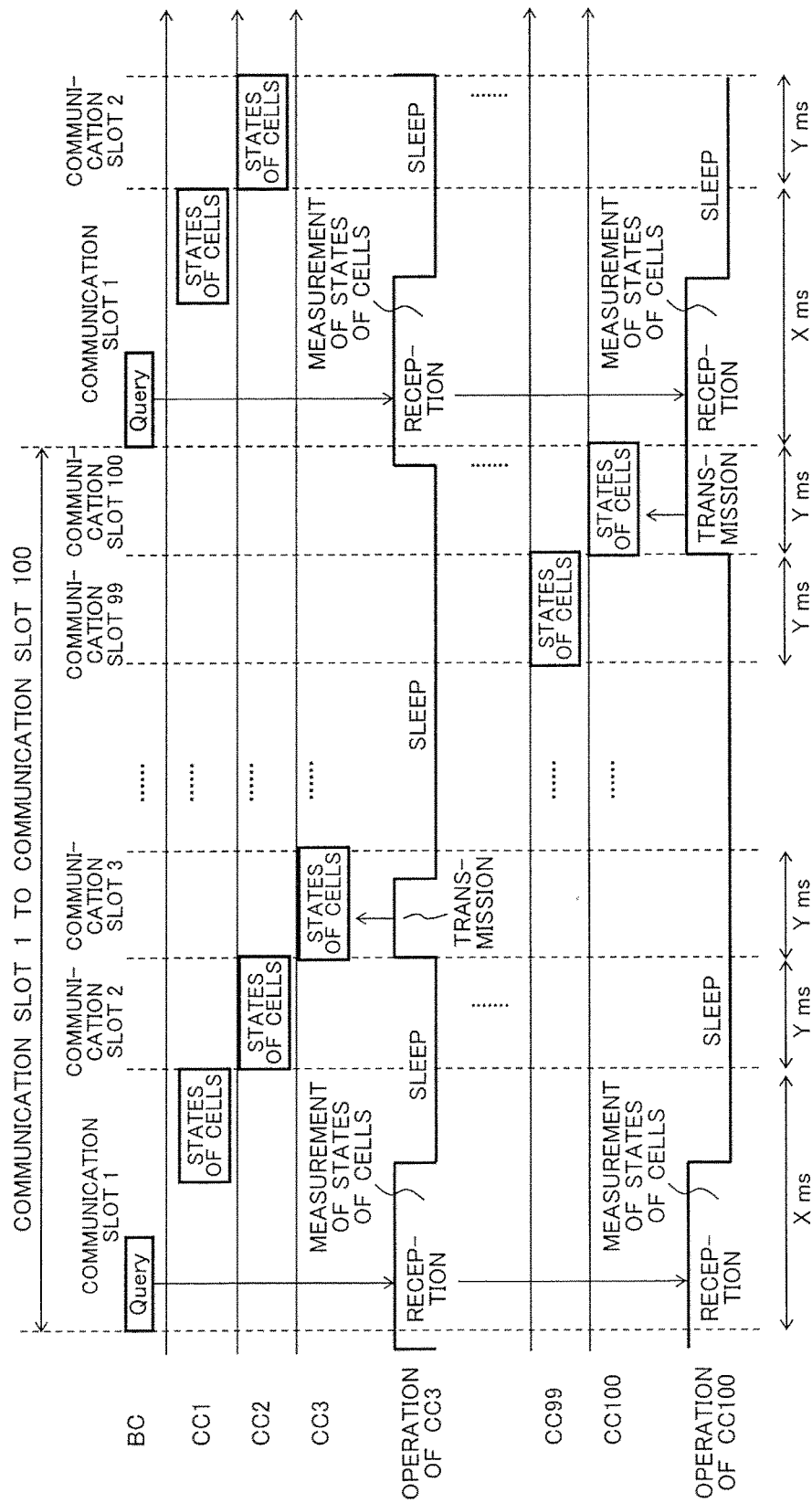
FIG. 4 is a timing chart showing a radio communication according to a second embodiment of the present invention.

FIG. 4 is a timing chart showing communication according to the second embodiment.

This drawing shows that the BC communicates with 100 cell controllers (CC 1 to CC 100) at 100 communication slots. As the number of communication slots, 100 (100 communication slots) is written to a memory 34 of each cell controller 100. As slot IDs, slot 1, slot 2, . . . , slot 100 are written to CC 1, CC 2, . . . , CC 100, respectively.

The battery controller 200 transmits a command that represents the beginning of slot 1 including its own ID (for example, a Query command). The Query command may contain a command that represents the number of communication slots=100.

Before receiving the Query command, CC 1 to CC 100 enter the reception state. When CC 1 to CC 100 receive the Query command, they measure the states of their own cells (for example, voltage, current, temperature) and maintain the states of the cells. Thereafter, CC 2 to CC 100 enter the sleep mode in which they operate with the low power consumption. In contrast, CC 1 transmits the states of the cells and then enters the sleep mode.

After a predetermined period of time elapses (X milliseconds=period of time of communication slot 1), CC 2 changes its mode from the sleep mode to the transmission/reception mode, transmits the states of the cells, and then enters the sleep mode again.

After a predetermined period of time elapses (X+Y (milliseconds), Y=period of time of communication slot 2 to 99), CC 3 changes its mode from the sleep mode to the transmission/reception mode, transmits the states of the cells, and then enters the sleep mode again.

After a predetermined period of time elapses (X+2×Y (milliseconds)), CC 4 changes its mode from the sleep mode to the transmission/reception mode, transmits the states of the cells, and then enters the sleep mode again.

After a predetermined period of time elapses (X+97×Y (milliseconds)), CC 99 changes its mode from the sleep mode to the transmission/reception mode, transmits the states of the cells, and then enters the sleep mode again.

After a predetermined period of time elapses (X+98×Y (milliseconds)), CC 100 changes its mode from the sleep mode to the transmission/reception mode, transmits the states of the cells, and receives a Query command.

After CC 1 to CC 99 transmit the states of their own cells, they enter the sleep mode. However, since CC 100 is going to receive a Query command, it enters the transmission/reception mode and receives the Query command. Each CC repeats the foregoing operation.

Although the battery controller 200 transmits a command that represents the beginning of slot 1 including its own ID (for example, Query command), it can change command types to vary a communication slot period. For example, Query—1 command denotes that the communication slot period of communication slot 1 is X1 (milliseconds) and that the communication slot periods of communication slots 2 to 100 are Y1 (milliseconds).

When each CC receives the Query—1 command, it operates corresponding to X1 and Y1. When CC 99 receives the Query—1 command, it measures the states of the cells (for example, voltage, current, and temperature) and maintains the states of the cells. Thereafter, CC 99 enters the sleep mode. After a predetermined period of time (X1+97×Y1 (milliseconds) elapses, CC 99 changes its mode from the sleep mode to the transmission/reception mode. After CC 99 transmits the states of the cells, it enters the sleep mode again. Thus, when each CC transmits data other than states of the cells (for example, data stored in the own memory), it can set an appropriate slot period, speed up communication, and reduce the power consumption.

Third Embodiment

FIG. 2 shows the circuit structure of the cell controller 100. In contrast, FIG. 5 shows a circuit structure of a cell controller 100 that can further reduce its own power consumption.

Like the first and second embodiments, according to a third embodiment, the cell controller 100 repeats the sleep mode and the transmission/reception mode. Since the power consumption in the sleep mode is as low as several µW to several ten µW, the cell controller 100 can operate with radio power transmitted from a battery controller 200.

Figure 5:
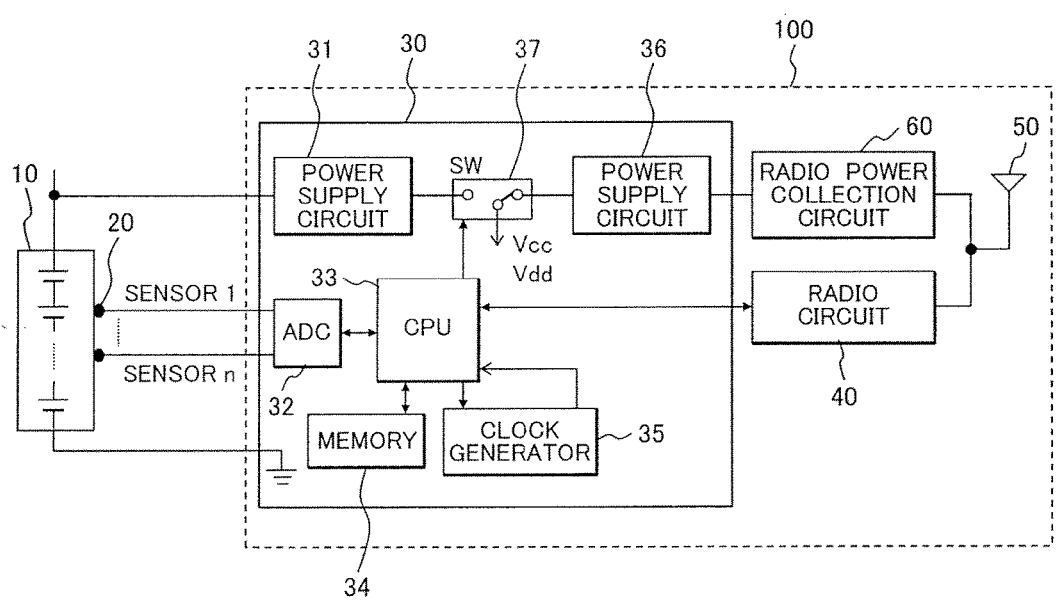
FIG. 5 is a circuit block diagram showing a cell controller (CC) according to the present invention.

Thus, the structure of the power supply of the cell controller 100 shown in FIG. 5 includes a radio power collection circuit 60 that generates operating power for the cell controller 100 from radio power received from the battery controller 200. An output of the radio power collection circuit 60 is input to a power supply circuit 36. The power supply circuit 36 is a second power supply circuit that obtains an operating voltage from the radio power and generates operating voltages (Vcc, Vdd) for the cell controller 100 and outputs the generated voltages to a switch 37 (SW). In addition, a voltage (power) of a cell group 10 is input to a power supply circuit 31. The power supply circuit 31 generates operating voltages (Vcc, VDD) for the cell controller 100 and outputs the operating voltages to the switch 37 (SW). The switch 37 (SW) outputs the voltages (Vdd, Vcc) that are output from the power supply circuit 31 or the voltages (Vdd, Vcc) that are output from the power supply circuit 36 depending on a signal received from a processing circuit by a signal of the processing circuit 33.

The processing circuit 33 causes the voltages (Vdd, Vcc) that are output from the power supply circuit 36 to be output when the cell controller 100 operates in the sleep mode and the voltages (Vdd, Vcc) that are output from the power supply circuit 31 to be output when it operates in the transmission/reception mode. Thus, since the power consumption of the cell group 10 decreases, the power consumption of the cell controller 100 can be decreased.

When cells are overdischarging (for example, cell voltage is 2 V or less), since the cell controller 100 cannot use the cell power (voltages), the cell controller 100 uses the voltages (Vdd, Vcc) that are output from the power supply circuit 36 even if the cell controller 100 operates in the transmission/reception mode. Thus, safety of cells is secured. In addition, if an abnormality such as cell overcharging occurs, the battery controller 200 can be informed of the states of the cells.

To effectively collect radio power, the distance between the battery controller 200 and each cell controller 100 needs to satisfy a predetermined condition. This is because the radio power ($P_R$) depends on the Friis' transfer formula expressed by the following formula (1) and is reversely proportional to the square of the communication distance (D).

[Mathematical Formula 1]

$$P_R = \left(\frac{\lambda}{4\pi D}\right)^2 G_T G_R P_T \quad (1)$$

where $P_R$: reception power (W), $P_T$: transmission power (W), $G_R$: reception gain (times), $G_T$: transmission gain (times), $\lambda$: wavelength (m), D: distance (m)

What is claimed is:

1. A radio battery system comprising:
a battery controller; and
a plurality of cell controllers,
the battery controller and the plurality of cell controllers communicating at a plurality of communication slots of a time division communication, wherein
the battery controller transmits data at a beginning of each of the plurality of communication slots,
each of the cell controllers measures a state of a cell at one or plurality of predetermined communication slots and transmits data at a predetermined communication slot, and
each of the cell controllers is capable of switching between a normal transmission/reception mode and a sleep mode with a low power consumption.

2. The radio battery system according to claim 1, wherein the battery controller broadcasts a slot number and an identification information of the battery controller as data at the beginning of each of the plurality of communication slots.

3. The radio battery system according to claim 1, wherein each of the cell controllers enters the transmission/reception mode before a predetermined communication slot occurs, receives the predetermined communication slot, measures the state of the cell, and enters the sleep mode, and
each of the cell controllers enters the transmission/reception mode again before the communication slot set by each of the cell controllers occurs, receives the data of the communication slot transmitted from the battery controller, transmits the state of the cell, and then enters the sleep mode.

4. A radio battery system comprising:
a battery controller; and
a plurality of cell controllers,
the battery controller and the plurality of cell controllers communicating at a plurality of communication slots of a time division communication, wherein
the battery controller transmits data at an initial communication slot of the plurality of communication slots,
each of the cell controllers receives the initial communication slot, measures a state of a cell, and transmits data at one or plurality of predetermined communication slots, and
each of the cell controllers is capable of switching between a normal transmission/reception mode and a sleep mode with a low power consumption.

5. The radio battery system corresponding to claim 4, wherein
each of the cell controllers enters the transmission/reception mode before a predetermined communication slot occurs, receives the predetermined communication slot, measures the state of the cell, and enters the sleep mode, and
after a period of time set by each of the cell controllers elapses, the cell controllers enters the transmission/reception mode again, transmits the state of the cell, and then enters the sleep mode.

6. The radio battery system according to claim 3, wherein each of the cell controllers includes a first power supply circuit that obtains an operating voltage from a cell to be measured and a second power supply circuit that obtains an operating voltage from a radio power, and
the first power supply circuit operates in the transmission/reception mode and the second power supply circuit operates in the sleep mode.

7. The radio battery system according to claim 5, wherein each of the cell controllers includes a first power supply circuit that obtains an operating voltage from a cell to be measured and a second power supply circuit that obtains an operating voltage from a radio power, and
the first power supply circuit operates in the transmission/reception mode and the second power supply circuit operates in the sleep mode.

8. A cell controller comprising:
a power supply circuit that obtains an operating voltage from a cell to be measured;
a radio circuit; and
an antenna that inputs and outputs a radio wave,
the cell controller communicating with a battery controller at a plurality of communication slots of a time division communication,
the cell controller measuring a state of the cell at one or a plurality of predetermined communication slots and transmits data at a predetermined communication slot, and
the cell controller being capable of switching between a normal transmission/reception mode and a sleep mode with a low power consumption.

9. The cell controller according to claim 8, further comprising:
a power supply circuit that obtains an operating voltage from a radio power, wherein
the power supply circuit operates in the sleep mode.

10. A battery controller comprising:
a power supply circuit;

a radio circuit; and
an antenna that inputs and outputs a radio wave,
the battery controller communicating with a cell controller at a plurality of communication slots of a time division communication, and
the battery controller broadcasting a slot number and identification information of the battery controller as data at a beginning of each of the plurality of communication slots.

* * * * *